(12) United States Patent  
Blackmore

(10) Patent No.: US 12,066,241 B2
(45) Date of Patent: Aug. 20, 2024

(54) MAGNETIC DOOR POSITION DETECTION APPARATUS

(71) Applicant: WELLINGTON DRIVE TECHNOLOGIES LIMITED, Auckland (NZ)

(72) Inventor: Kevin Richard Blackmore, Auckland (NZ)

(73) Assignee: Wellington Drive Technologies Limited, Auckland (NZ)

( * ) Notice: Subject to any disclaimer, the term of this patent is extended or adjusted under 35 U.S.C. 154(b) by 0 days.

(21) Appl. No.: 18/018,181

(22) PCT Filed: Jul. 30, 2021

(86) PCT No.: PCT/NZ2021/050119
§ 371 (c)(1),
(2) Date: Jan. 26, 2023

(87) PCT Pub. No.: WO2022/025776
PCT Pub. Date: Feb. 3, 2022

(65) Prior Publication Data
US 2023/0266049 A1 Aug. 24, 2023

(30) Foreign Application Priority Data
Jul. 30, 2020 (NZ) .......................... 766681

(51) Int. Cl.
F25D 23/02 (2006.01)
G01D 5/14 (2006.01)
G01D 18/00 (2006.01)

(52) U.S. Cl.
CPC ............ F25D 23/028 (2013.01); G01D 5/14 (2013.01); G01D 18/006 (2013.01); F25D 2700/02 (2013.01)

(58) Field of Classification Search
CPC ................ G01R 33/00; G01R 33/0017; G01R 33/0023; G01R 33/0029; G01R 33/0035;
(Continued)

(56) References Cited

U.S. PATENT DOCUMENTS 6,811,236 B1 * 11/2004 Spong ................... E05C 19/166
49/276
10,488,464 B2 11/2019 Boury
(Continued)

FOREIGN PATENT DOCUMENTS

| CN | 108562103 A | 9/2018 |
| CN | 110319764 A | 10/2019 |
| WO | 2020099371 A1 | 5/2020 |

OTHER PUBLICATIONS

International Search Report issued in PCT/NZ2021/050119; mailed Nov. 16, 2021.

Primary Examiner — John R Lee
(74) Attorney, Agent, or Firm — Studebaker & Brackett PC

(57) ABSTRACT

In one aspect the invention provides a magnetic door position detection apparatus adapted to attach to a cabinet interior with a door arranged to transition between an open state where the interior of the cabinet is accessible, and a closed state. The door includes a magnetic field generating structure configured to magnetically engage the door with the cabinet in the closed state. The apparatus provided includes a housing configured to attach to the interior of the cabinet and one or more sensors configured to determine change in the magnetic flux field within the interior of the cabinet induced by motion of the magnetic field generating structure in at least one of three orthogonal axes. The sensor or sensors generate an output signal representing the sensed
(Continued)

magnetic field change where the one or more axes is indicative of the cabinet door moved between the closed state and the open state.

17 Claims, 13 Drawing Sheets

(58) Field of Classification Search
CPC .............. G01R 33/0047; G01R 33/007; G01R 33/0076; G01R 33/0082; G01R 33/0094; G01R 33/02; G01R 33/0206; G01R 33/038; G01R 33/10
See application file for complete search history.

(56) References Cited

U.S. PATENT DOCUMENTS

| | | |
|---|---|---|
| 11,512,890 B2 * | 11/2022 | Bechtle ................. G03B 15/00 |
| 2009/0173119 A1 * | 7/2009 | Hunt .................... E05C 19/166 |
| | | 70/277 |
| 2011/0227567 A1 | 9/2011 | Reidmueller et al. |
| 2015/0330140 A1 | 11/2015 | Kincaid et al. |
| 2016/0054148 A1 | 2/2016 | Misfatto |
| 2019/0128596 A1 | 5/2019 | Gmeinder et al. |
| 2019/0206206 A1 | 7/2019 | Smith |
| 2023/0266049 A1 * | 8/2023 | Blackmore .......... G01D 18/006 |
| | | 49/381 |

* cited by examiner

MAGNETIC DOOR POSITION DETECTION APPARATUS

FIELD OF THE INVENTION

The present disclosure relates to an apparatus and method for detecting a cabinet door opening and closing state by sensing changes in magnetic field.

BACKGROUND OF THE INVENTION

In this specification, where reference has been made to external sources of information, including patent specifications and other documents, this is generally for the purpose of providing a context for discussing the features of the present invention. Unless stated otherwise, reference to such sources of information is not to be construed, in any jurisdiction, as an admission that such sources of information are prior art or form part of the common general knowledge in the art.

There is a need in industry to detect door opening and closing events. One particular industry is the refrigeration industry where refrigerated cabinet door opening and closing events can be used to determine equipment productivity and to supplement data used in control or optimisation of refrigeration system operation. Similar requirements are also present in relation to other types of cabinets, such as those providing a heated or humidity controlled environment.

The prior art has made some attempt to detect door opening and closing events, for example, physical switches located on the door interface which are mechanically actuated by door opening and closing events. Such switches are problematic in terms of waterproofing and robustness issues. They also require precise positioning which makes retrofitment difficult in many circumstances.

In another example, a yaw sensor has been mounted on the door of a cabinet. However, detection of door opening events are best used in conjunction with cabinet temperature data. Such door mounted sensors provide poor thermal coupling with the inside of the fridge cabinet for temperature monitoring, and are visually conspicuous for use with a glass door.

Magnetically actuated sensors have also been used which detect proximity to a discrete magnet. These include both simple reed switches and more sophisticated magnetic field detecting devices. With refrigerated cabinets this magnet and sensor combination are normally embedded on or located immediately adjacent to the door of the cabinet, with one part on the door and the other on the cabinet wall. A magnet and sensor are both required components and those components must align with close tolerance for the sensor to function. Such devices are prone to failure if a door hinge were to sag.

These magnet and sensor combinations rely on the sensor detecting a significant change in magnetic field strength by being located in the primary flux path of the magnet. As the magnetic field experienced by the sensor is overwhelmingly due to the presence or temporary absence of the related magnet no account needs to be made for fluctuations in the local magnetic field caused by other sources. In particular no account needs to be made of changes in orientation of the cabinet, variations in the Earth's magnetic field caused by solar activity, the presence of additional nearby magnetic fields—such as variable fields caused by electric motors—or variations in the local magnetic field inside the cabinet caused by redistribution of the contents of the cabinet. Such devices may have the capability to self-tune, but they do so to account for variations in the particular installation, not for such dynamic variations in the magnetic environment unrelated to the door operation and may therefore tune infrequently and in controlled circumstances.

It is therefore an object of the present invention to improve upon the prior solutions of art, or at least provide the public with a useful choice. In particular it would be of advantage to have a magnetic cabinet door position detection system which did not rely on a magnetic sensor positioned on or immediately next to the cabinet door, or a discrete magnet to provide the signal. A system which utilised a magnetic sensor located outside of the primary flux path of a magnet associated with the cabinet door and which could account for variations in the magnetic field experienced in the interior of the cabinet not caused by movement of the door would also be of advantage.

DISCLOSURE OF THE INVENTION

According to various broad embodiments the invention relates to a magnetic door position detection apparatus adapted to attach to the interior of a cabinet, the cabinet having at least one door arranged to transition between an open state where the interior of the cabinet is accessible, and a closed state, the door including a magnetic field generating structure configured to magnetically engage the door with the cabinet in the closed state;
wherein the apparatus includes:
a housing configured to attach to the interior of the cabinet; one or more sensors configured to determine change in the magnetic flux field within the interior of the cabinet induced by motion of the magnetic field generating structure in at least one of three orthogonal axes, and generating an output signal representing the sensed magnetic field change; and
wherein the motion of the magnetic field generating structure in the one or more axes is indicative of the cabinet door moved between the closed state and the open state.

In some embodiments the one or more sensors of the apparatus are configured to determine change in the magnetic field in three orthogonal axes.

In some embodiments, the apparatus is adapted to mount to the interior of the cabinet at about 75 mm from the door frame and/or magnetic field generating structure. In some further embodiments, the sensor apparatus is adapted to mount to the interior of the cabinet up to 100 mm from the door frame and/or magnetic field generating structure.

In some embodiments, the apparatus further includes one or more sensors operable to determine the temperature of the interior of the cabinet.

In some embodiments, the magnetic flux field within the interior of the cabinet is primarily or predominantly provided by the magnetic field of the planet earth.

In some embodiments, the interior of the cabinet lies outside of the primary flux paths of the magnetic field generating structure.

In some embodiments, the one or more sensors of the apparatus are configured to determine changes in the magnetic flux field in the order of 0-10 Gauss.

In some embodiments, the apparatus further includes a processor configured to receive the sensor output signal and detect a change of door state by the steps of:
sample the instantaneous received sensor output signal of at least one axis after each of a first time period,
repeatedly determine an average of sampled instantaneous sensor output signals, for at least one axis, over a second time period, determine a difference between an instantaneous determined average value and a previous determined average value preceding by a third time period, compare the determined difference to a difference threshold, and determine a change of door state when:

the threshold is met, and the threshold is met for at least a threshold time period.

In some embodiments, the apparatus processor is further configured to determine the axis with the largest signal of the three orthogonal axes, and the at least one axis is the at least one axis with the largest signal.

In some embodiments, the apparatus processor is further configured to, when the threshold is met, determine the magnitude and orientation of the vector sum of the three axes, and determine a change of door state when the vector sum meets a threshold for at least the fourth period of time.

In some embodiments the apparatus includes a processor configured to execute steps of algorithm including:

sample the instantaneous received sensor output signal of at least one axis filter noise from the signal executing a self-tuning edge detection algorithm on the filtered signal reject any edges which are not due to a door being opened and/or closed determine a change of door state when any detected edge is not rejected.

In some embodiments a self-tuning edge detection algorithm executed on the filtered signal determines and formats a vector for the instantaneous measured magnetic field relative to a magnetic field calibration for a closed door state.

In some embodiments the magnitude of the determined instantaneous measured magnetic field vector is differentiated over time to detect edges.

In some embodiments detected edges which do not meet a change threshold value are rejected and detected edges which meet the change threshold value indicate a change of door state.

In some embodiments detected edges which equal or exceed the change threshold value indicate a change of door state from closed to open if the differentiated value is positive in magnitude, and from open to closed if negative In some embodiments the apparatus processor executes an additional step of refreshing a magnetic field calibration associated with the closed door state using the sampled instantaneously received sensor output signal when the differentiated signal meets a stability threshold value.

In some embodiments the magnetic field calibration associated with the closed door state is refreshed when the differentiated signal exhibits a value which equals or is below a stability threshold value.

In some embodiments the processor may update a door state variable from closed state to a not closed state when a detected edge is not rejected and determines a change of door state, and the processor subsequently updates the door state variable from the not closed state to the closed state after the expiry of a delay timer.

In some embodiments, the invention relates to any one or more of the above statements in combination with any one or more of any of the other statements. Other aspects of the invention may become apparent from the following description which is given by way of example only and with reference to the accompanying drawings.

The entire disclosures of all applications, patents and publications, cited above and below, if any, are hereby incorporated by reference. This invention may also be said broadly to consist in the parts, elements and features referred to or indicated in the specification of the application, individually or collectively, and any or all combinations of any two or more of said parts, elements or features, and where specific integers are mentioned herein which have known equivalents in the art to which this invention relates, such known equivalents are deemed to be incorporated herein as if individually set forth.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting.

BRIEF DESCRIPTION OF THE DRAWINGS

Additional and further aspects of the present invention will be apparent to the reader from the following description of embodiments, given in by way of example only, with reference to the accompanying drawings in which.

Figure 1:
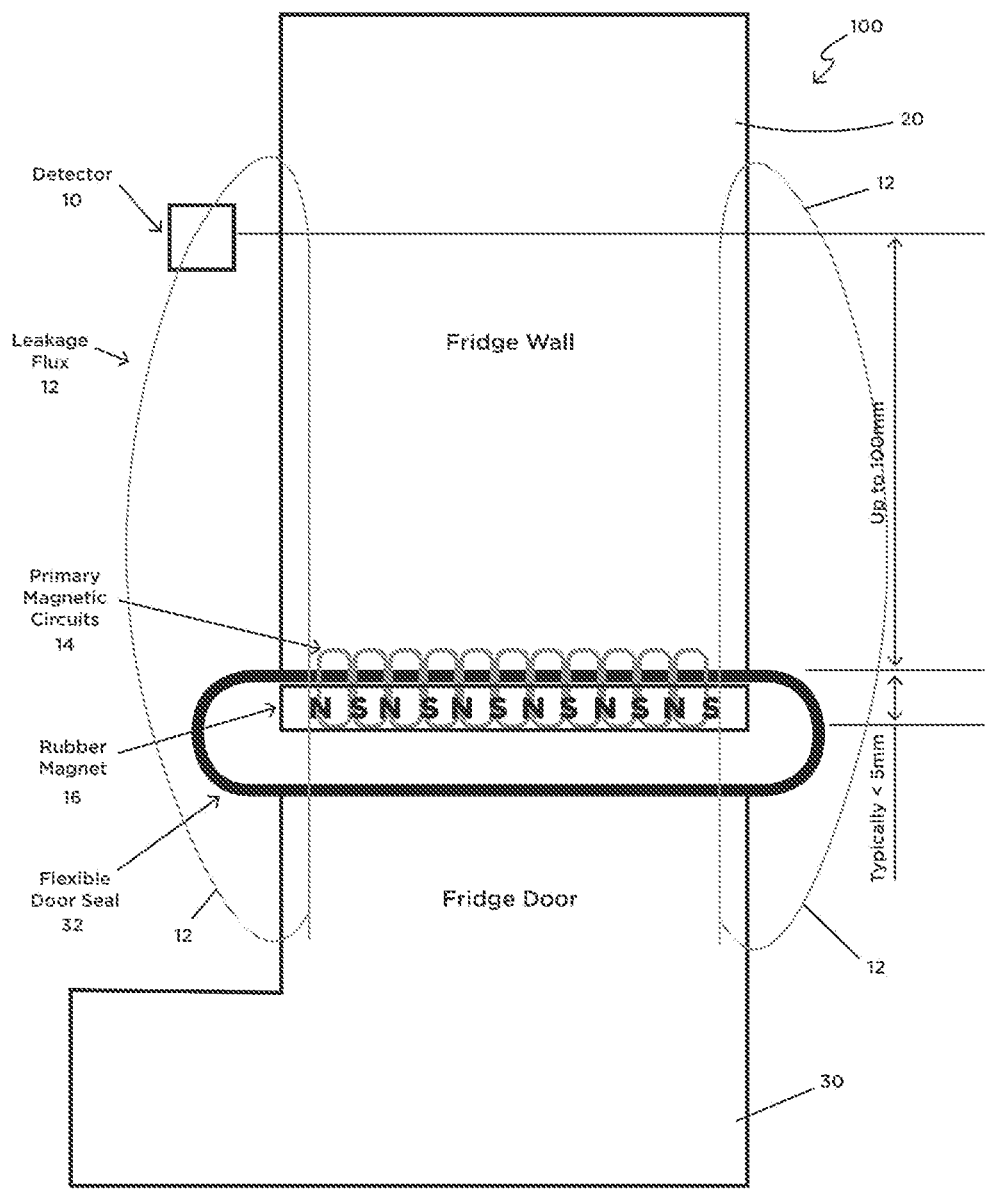
FIG. 1 is a schematic view of a detector device arranged on the internal wall, proximate a door of a refrigerated cabinet.

Further aspects of the invention will become apparent from the following description of the invention which is given by way of example only of particular embodiments.

BEST MODES FOR CARRYING OUT THE INVENTION

Exemplary methods and systems are described herein. It should be understood that the word "exemplary" is used herein to mean "serving as an example, instance, or illustration." Any embodiment or feature described herein as "exemplary" or "illustrative" is not necessarily to be construed as preferred or advantageous over other embodiments or features. More generally, the embodiments described herein are not meant to be limiting. It will be readily understood that certain aspects of the disclosed systems and methods can be arranged and combined in a wide variety of different configurations, all of which are contemplated herein.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Embodiments of the invention relate to an apparatus for determining when the door of a cabinet is opened and closed. Particular uses of the apparatus are with refrigerated cabinets where data derived from many sources is desired for safe and efficient operation of the cabinet. For example, in a refrigerated cabinet used commercially, it is often important to record or monitor data indicating the internal operating temperature of the cabinet. Such data may be used, for example, to derive an understanding of normal or abnormal operating characteristics, to identify an undesired effect such as power loss, a door being left open, or understand whether abnormal operating characteristics may be developing such as emerging wear or damage of parts. Such data may be remotely monitored, for example, by a service provider who can take action to tend to an issue that has occurred or may be developing, or logged for periodic review.

Those skilled in the art will also appreciate that the invention may be used in combination with a range of different types of cabinets and reference made throughout this specification to refrigerated cabinets in isolation should in no way be seen as limiting.

Data indicating the door of a refrigerated cabinet is open or closed is useful information to supplement the internal cabinet temperature monitoring described above. For example, in a scenario where the temperature of a cabinet may rise to an undesired level, it is useful to understand whether the rise in temperature is caused by a trivial event such as the cabinet door being left open, or a more sinister event such as failing or failed hardware.

In preferred embodiments, the apparatus includes one or more sensors configured to sense changes in magnetic fields in the vicinity of the door of an aforementioned cabinet, such as within the interior of the refrigerated cabinet. A suitable cabinet has at least one door arranged to transition between an open state where the interior of the cabinet is accessible, and a closed state where the interior of the cabinet is substantially sealed by a cabinet door. In the refrigerated cabinet example, the interior of the cabinet is typically thermally sealed by closing of the door. To maintain the thermal seal, refrigerated cabinets typically include one or more magnetic field generating structures or magnetic elements in the region of the door which aligns with a surface of the cabinet when in the closed state. This magnetic structure acts to magnetically engage the door with the cabinet. For example, a permanent magnet is often located within the door seal of a refrigerated cabinet such that the magnet within the seal engages with the cabinet when the door is closed. An electromagnet is equally applicable in place of, or to supplement, a permanent magnet used as a magnetic field generating structure.

When the door having a magnetic structure is in the closed state, magnetic flux will radiate from the location of the magnetic structure to other proximate locations, including within the interior of the cabinet. Additionally, the presence of the magnetic structure will cause perturbations in the background magnetic field extending to a distance considerably greater than that to which flux generated by the magnetic structure radiates.

The apparatus is configured for attachment to the interior of a cabinet at a distance from a magnetic structure positioned in the door seal but in a location proximate the areas where stray magnetic flux will radiate, or the background field will be distorted by the magnetic structure when the door is closed. Positioning of the apparatus within the interior of the cabinet at a distance from the door allows for easy retro-fitment to an existing cabinet. However, in such positions, the flux fields are weak and difficult to detect. The background magnetic field experienced in such cabinet interior locations are is typically predominantly the Earth's magnetic field, and movements of the magnetic structure may present as relatively small deviations applied to this field. In various embodiments the invention may be used to detect perturbations in the magnetic field flux within the interior of the cabinet caused by the motion of the adjacent magnetic field structure associated with the door of the cabinet. The perturbations or disturbances in the magnetic field experienced in the interior of the cabinet can be detected with a comparison to measurements made of this field when the door is not moving.

In various embodiments the invention may employ a calibration procedure to accurately identify door movement based magnetic field perturbations and eliminate false positives caused by the presence of unrelated materials which also have an impact on the magnetic field of the cabinet interior. For example in such applications where the changes in magnetic field strength are very small, false positive perturbations may be caused by intermittent operation of adjacent electrical devices, solar activity, changes in the orientation of the cabinet relative to the Earth's magnetic field and/or changes in the contents of the cabinet.

Embodiments discussed herein present techniques for making a useful determination of a door-open or door-closed state from the weak magnetic fields. Such embodiments therefore resolve installation problems by allowing easy attachment of the apparatus and eliminating the need for precise positioning of the apparatus. In further embodiments where the invention also incorporates a temperature sensor this characteristic allows for placement of the apparatus in preferred cabinet interior locations which are optimise for accurate temperature sensing.

Reference in general is made throughout the specification to invention providing a magnetic door position detection apparatus. Those skilled in the art will appreciate that the detection of a change in state of such a door from a closed state to an open state or motion of the door from closed to open or open to closed are within the scope of events which may be detected. Reference is also used interchangeably throughout the specification to the invention detecting the state of the door, encompassing conditions such as:

the door being closed and stationary,
the door moving away from a closed position, the door being open and stationary,
the door moving towards the closed position.

Those skilled in the art will appreciate that in some embodiments a door position detection apparatus may also function effectively by detecting when the door is closed and stationary, and when the door is in any other state or configuration. In preferred embodiments the apparatus provided by the invention may simply operate in such a fashion, detecting when the door is closed, and detecting when the door is not closed.

FIG. 1 illustrates one embodiment of the invention through a schematic view of the magnetic door position detection apparatus ("detector") 10 arranged on the internal wall, proximate a door edge 30 which facilitates access to the interior of a refrigerated cabinet 20. To seal the door edge 30 to the cabinet wall 20, a seal 32 is provided. The seal 32 is typically deformable to a degree to provide for some tolerance between the door and cabinet edges while maintaining substantially airtight barrier which minimises thermal transfer from the cabinet interior and the environment.

A magnetic field generating structure 16 is disposed within the seal 32. The magnetic structure 16 is arranged such that it is positioned in close proximity to the cabinet wall 20 when the door is in the closed state. The magnetic force applied by the structure assists the door seal 32 and door 30 to maintain an engagement with the cabinet wall 20.

In some embodiments, the magnetic structure is a rubber based magnetic strip 16 as depicted by FIG. 1. However, the magnetic structure may be any device which creates a magnetic field, including electromagnetic devices.

A rubberised magnetic strip is typically a sequence of discrete magnetic elements arranged in antiparallel as indicated. This sequence creates primary magnetic flux paths 14 which travel between adjacently aligned magnetic poles. However, the ends of the magnetic strip also create an effectively large magnetic pole and that pole creates a larger magnetic flux leakage path 12 which extends from the pole ends of the strip.

The primary flux paths 14 are typically strong which makes them useful for holding the door in the closed state. Further, the primary magnetic flux paths 14 extend only about five millimetres from the magnetic strip which makes them effective at facilitating engagement between the door and cabinet at only short ranges. In the case of the prior art, an electronic device including magnetically sensitive switch may be usefully positioned within the cabinet and close to the door such that it lies within the range of the primary magnetic flux path and is able to detect strong fluctuations in magnetic field to thereby determine a door-open or door-closed state. However typically this requires the device to be placed within the structure of the cabinet wall so as to achieve adequate proximity to the primary flux paths of the magnetic strip, which makes retrofitting such a device to an existing cabinet impractical.

In addition to door-closed state detection, it is also desired to also include, for example, temperature sensing components. Placement of the apparatus in close proximity with the door leads to inaccurate sensing of temperature within the cabinet interior. Further, prior art devices mounted to the door may occlude access to the interior of the cabinet which may impact on the functionality of the cabinet. Therefore, it is more desirable to have a door position detection apparatus located deeper within the cabinet such that accurate temperature sensing is possible. Placement of the apparatus deeper into the interior of cabinet aids inconspicuousness, meaning users of the refrigerated cabinet are less likely impacted by its presence of the apparatus.

The secondary leakage flux path 12 may extend much further from the magnetic strip, however the field strength is considerably smaller than that of the primary flux path—around $1/1000$th or less. The sensing of such weak magnetic fields is plagued by issues due to weak field strength. With such weak fields, there are issues to overcome including: the Earth's magnetic field strength being in the same order of magnitude as the secondary flux field strengths; the nearby placement of metallic objects (such as a food or drink can) can affect the field strength, and that magnetic field detection circuits are affected by the temperature of their environment to an extent, which means opening and closing of the door, and subsequent changes in interior temperatures, causes the detection circuit calibration to change.

FIG. 1 further indicates the apparatus 10 attached to the interior wall of the cabinet 20 and positioned about 100 mm from the magnetic structure 16, and in the secondary, leakage or stray flux field.

Figure 2:
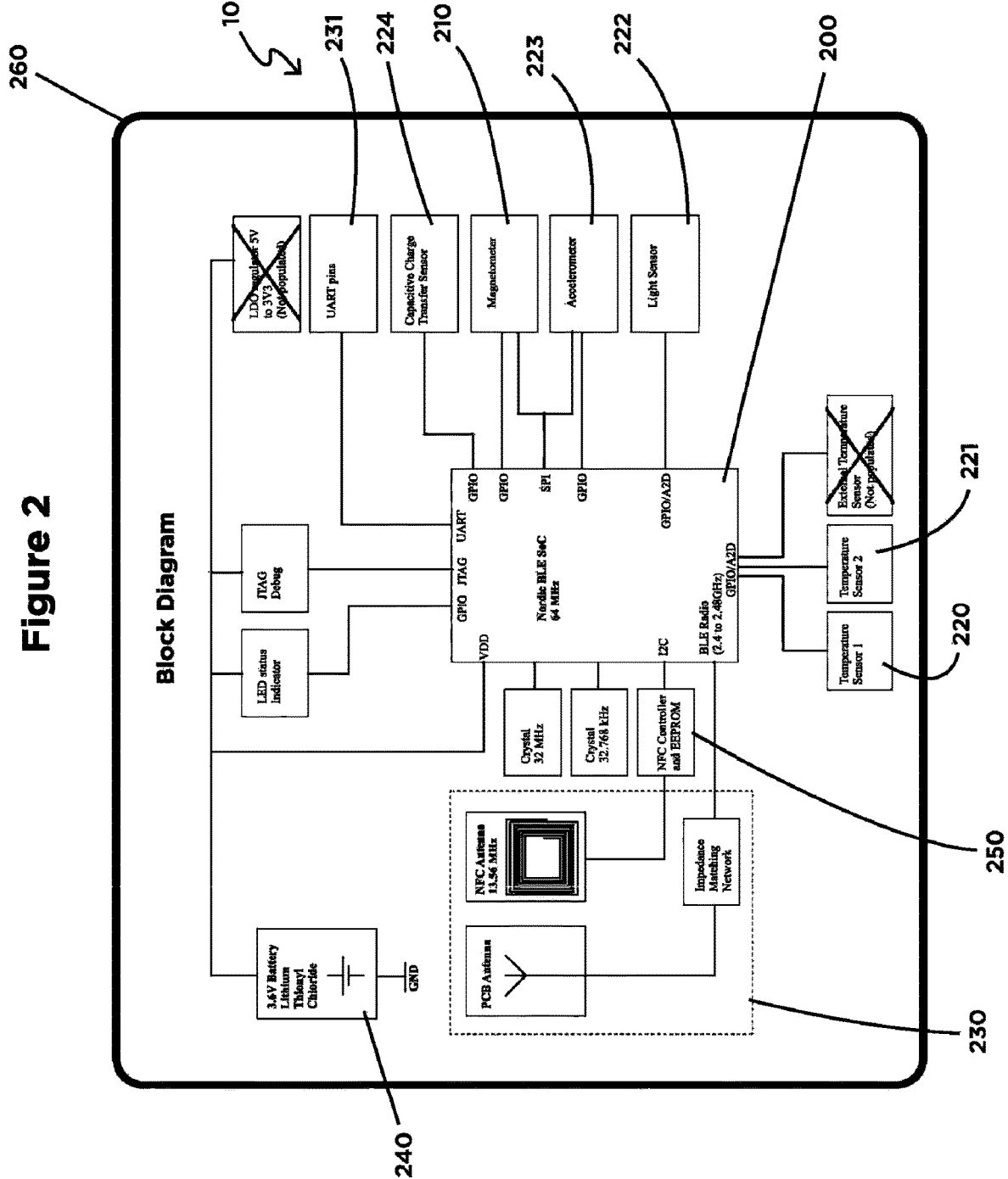
FIG. 2 is a schematic of the detector device including exemplary components thereof.

FIG. 2 shows a control system schematic of the detector device 10 according to various preferred embodiments including exemplary components thereof. Key components of the apparatus 10 include a processor 200 configured to receive sensor inputs, perform computational tasks and output data. The processor may be powered by a battery 240 as shown, or provided with a source of external power. To communicate with a remote monitoring system, or to communicate any stored data, a wireless 230 and/or wired 231 interface is provided.

The apparatus 10 further includes a magnetic field detection device 210 sensitive to magnetic fields on three orthogonally arranged, or Cartesian axes. One suitable example of the magnetic field detection device 210 is a three-axis magnetometer such as ST LIS2MDL integrated circuit.

In various embodiments, the processor is operatively connected to one or more temperature sensors 220, 221 which are in turn configured to report on operational temperature of the cabinet interior.

In various embodiments, the processor is operatively connected to one or more additional sensors, such as an accelerometer 223 for the detection of movement, a light sensor 222, and/or a capacitive charge sensor 224.

In various embodiments, a housing 260 is provided for containment of the processor and sensors. To facilitate retro-fitment of the device to a cabinet, the housing may optionally include one or more apertures to allow pass-through of a fastener to attach the housing to the interior of the cabinet. Alternatively, the housing may be attached to the interior of the cabinet by double sided tape or similar.

In the embodiment shown the magnetic field detection device 210 of the apparatus 10 is configured for sensing the magnetic flux field of the magnetic field generating device in three orthogonal axes, and generating an output signal representing the sensed magnetic field property on each axis. The processor 200 is configured to receive the field strength data on each of the three axes and determine a door-open or door-closed state by computation of an algorithm. For retro-fitment, the three axes usefully allow for a variety of mounting angles by ensuring that a magnetic field in any direction can be measured by a combination of one or more of the three axes.

In various embodiments the processor is configured to execute steps of an algorithm which includes:
(i) sample the instantaneous received sensor output signal of at least one axis after each of a first time period, (ii) repeatedly determine an average of sampled instantaneous sensor output signals, for at least one axis, over a second time period, (iii) determine a difference between an instantaneous determined average value and a previous determined average value preceding by a third time period, (iv) compare the determined difference to a difference threshold, and (v) determine a change of door state when:
the threshold is met, and
the threshold is met for at least a threshold time period.

In further embodiments processor is configured to execute steps of algorithm comprising:

sample the instantaneous received sensor output signal of at least one axis filter noise from the signal execute a self-tuning edge detection algorithm on the filtered signal reject any edges not due to a door being opened and closed.

determine a change of door state when any detected edge is not rejected

Those skilled in the art will appreciate that in various embodiments the invention may be implemented using algorithms of various forms. In some embodiments such an algorithm may determine an average of sampled instantaneous sensor output signals, which potentially has the ability to take into account localised changes in the environment of a refrigerated cabinet that occur over time and have no relation to door open or close events. Furthermore in additional embodiments an algorithm may utilise a self-tuning edge detection algorithm in combination with noise filtering techniques as referenced above. For example, in some particular embodiments the algorithm executed by the processor may implement an infinite impulse response (IIR) filter or the equivalent thereof.

Figure 3:
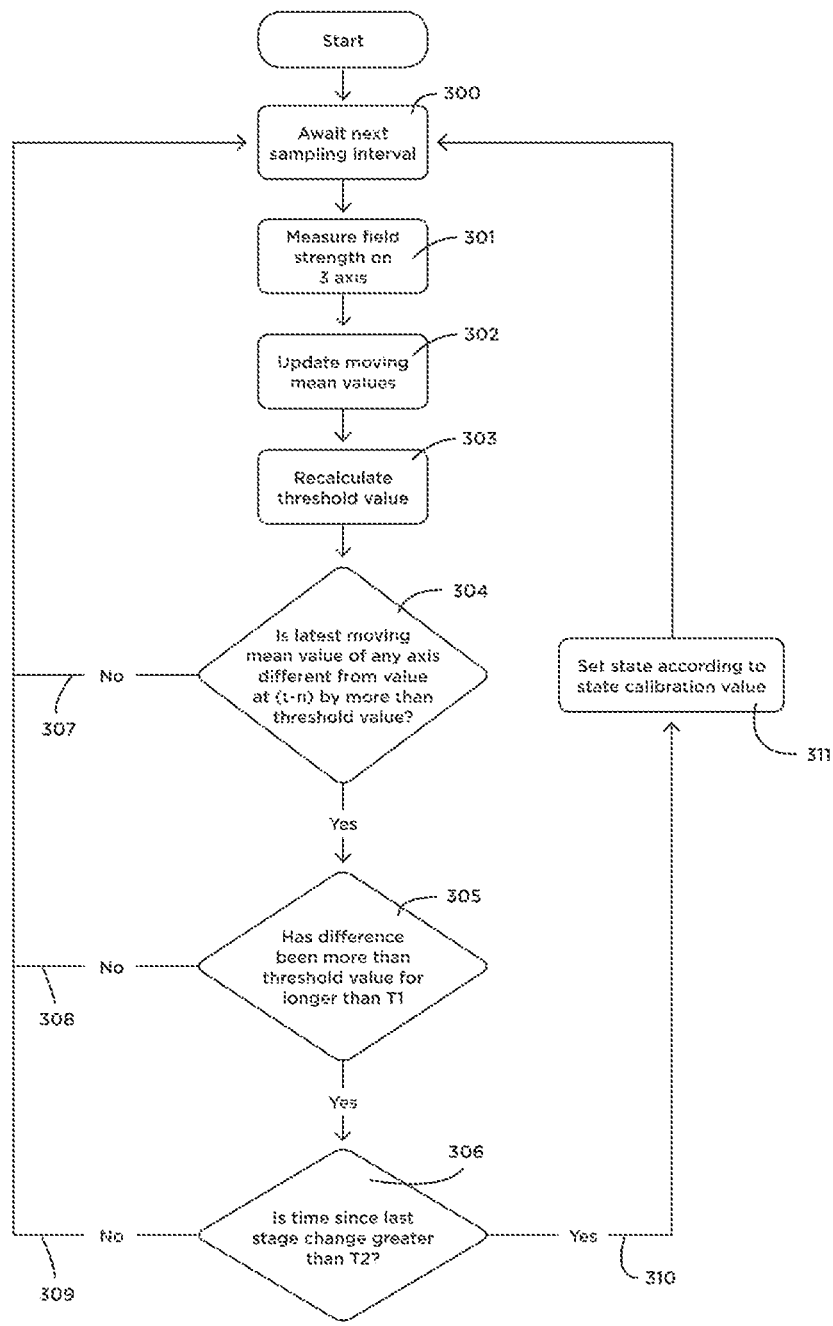
FIG. 3 is a flow diagram outlining steps of a control system for determining a door opening event as implemented in one embodiment.

FIG. 3 shows an overview of steps of an exemplary algorithm used in one embodiment to determine a door-open or door-closed state from the magnetic field information in further detail. At step 300, the processor is configured to sample the three axis of the magnetometer at a particular sample rate, such as for example, at every 200 ms time interval.

At step 301 and at each time interval from step 300, the processor is configured to sample of the field strength of each axis. Each sample may be stored by conventional memory device means coupled to the processor.

At step 302 the processor is configured to determine the average value of a finite number of samples recorded. The finite number may be predetermined by, for example, as the number or samples, or the samples recorded in an elapsed time interval. In this way, a moving and time limited average variable is created. The moving average is based on a time window of, for example, between one and five seconds. The processor is configured to store several determined values such that newly determined average values are able to be compared to newly determined average values.

At step 303, the processor is configured to calculate a threshold or difference value. In one embodiment this is calculated as a percentage (e.g. 10%) of the most recent moving average sensor reading. In another embodiment, it is calculated as a different value for each of the three axes based on that axis' sensor reading.

In some alternative embodiments, the threshold is calculated based on the sensor values, and/or may be input by a user based on, for example, a calibration procedure following setup or installation.

At step 304, the processor is configured to determine whether the threshold has been met. This is determined by, for example, determining whether the current moving mean value of any axis is different from historic, previously sampled values. For example, the determination is to calculate whether (t−n) is greater than the threshold value, where t is a contemporary value, and n is a historic value. If the determination is 'no', the processor is configured to return to the start of the procedure and record a new sample. A useful range of values for time differences between new values and historic values is about 0.5 to 3 seconds.

If the determination is 'yes', at step 305 the processor is further configured to determine whether a time threshold has been met for at least a threshold time period. A range of values for the threshold time period, is, for example between 0.5 and 3 seconds. If the determination is 'no', the processor is configured to return to the start of the procedure and record a new sample.

If the determination is 'yes', an optional step 306 the processor is further configured to reference a previous determination of a change in door state, and determine whether a further threshold time period (T6) has been exceeded. If the determination is 'no', the processor is configured to return to the start of the procedure and record a new sample at step 209. The threshold time period is operable to exclude unrealistic time frames between when a door-open or door-closed state transition from causing a false determination. If the determination is 'yes', the processor is configured, at step 310, to advance the algorithm to step 311 where a door-open or door-closed state change is set.

Figure 4:
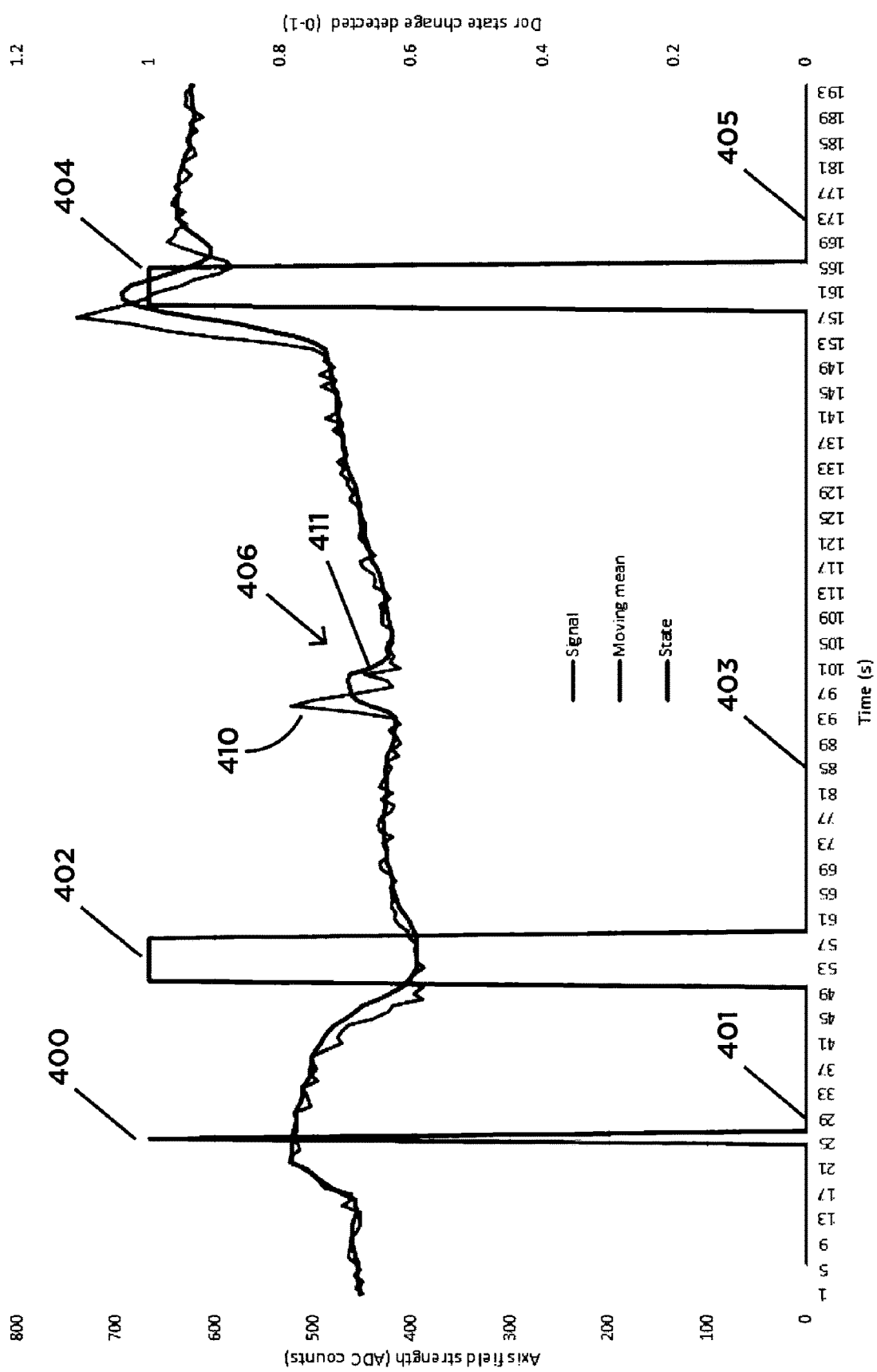
FIG. 4 is timeline showing data and detected state change events related to the flow diagram of FIG. 3.

FIG. 4 shows a graph showing raw sensor data, moving mean data, and state determination operation of the processor in following the process of FIG. 3. In particular: Raw signal data 410 is from one magnetometer axis; Moving mean filtered data 411; and state change information 400-405 are shown. Door state change events are indicated by 400, 401, 402, 403, 404 and 405. As can be observed, the raw signal data from the magnetometer fluctuates considerably over a 'steady state' condition, illustrating why the mere application of a simple amplitude threshold to the raw data, or the moving mean data, to determine door state changes would not provide a useful outcome. It may also be observed that the fluctuation in raw signal data, or the moving mean data, is not immediately indicative of door state changes.

In some embodiments, the processor is further configured to determine whether the door state changes 400-401, 401-402, 402-403, 403-404, and 404-405 are a change from open to closed, or closed to open states. Further, the processor is configured to determine one of the three magnetometer axes to be monitored as a priority axis over the remaining axes.

Figure 5:
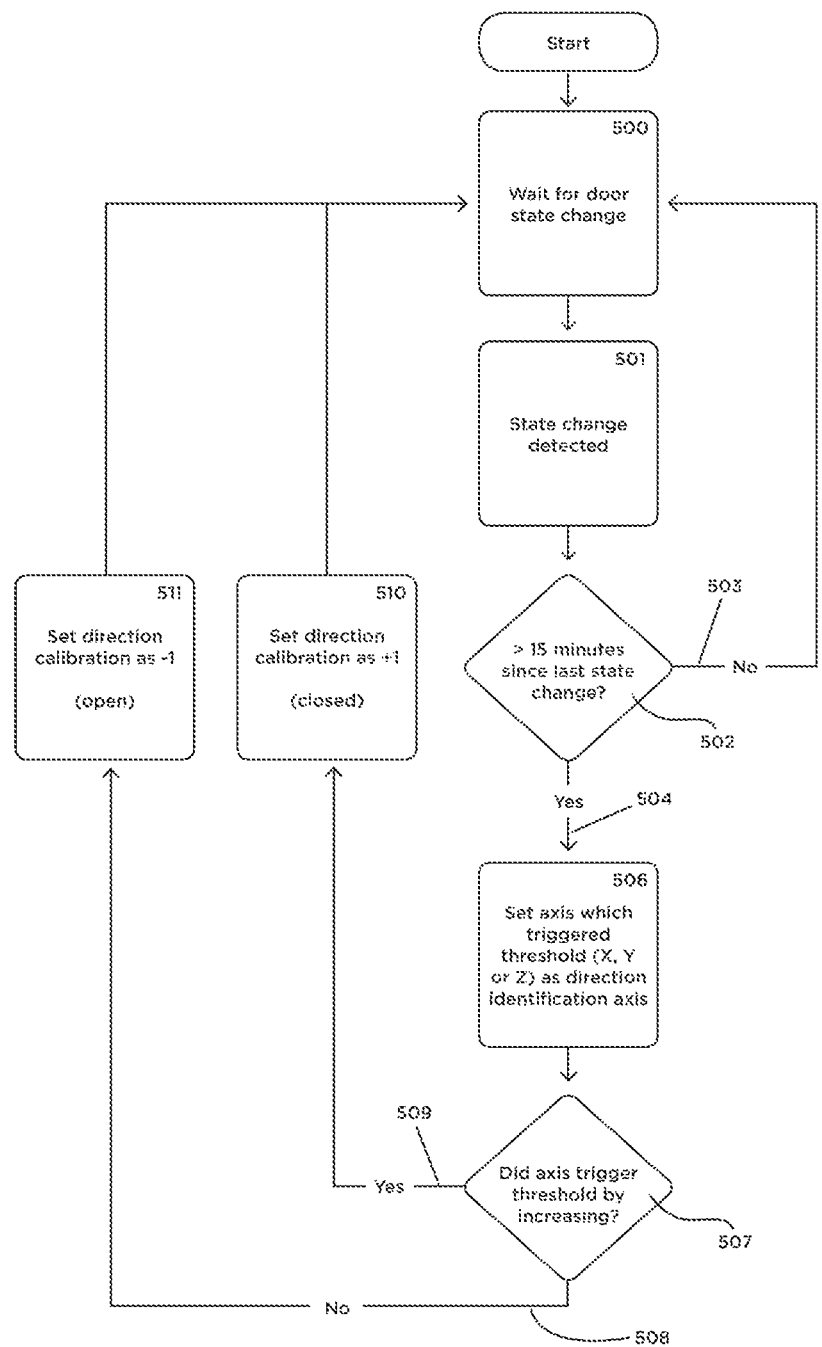
FIG. 5 is a flow diagram outlining steps of a control system for determining door opening direction as implemented in one embodiment.

FIG. 5 shows a diagram of process steps operable to determine an open to closed, or closed to open door state change as implemented in a further embodiment. Since the most probable door state during periods of inactivity is to be closed, the first state change after a period of inactivity can be assumed to be opening, and the changes which occur during this event can be used to identify signal behaviour which is characteristic of a closed to open as distinct from open to closed event. This behaviour can be used to characterise future state changes.

At step 500, the process commences by waiting for a state change as determined by, for example, the process outlined with reference to FIG. 3.

At step 501, the processor is configured to determine a state change.

At step 502, the processor is configured to compare the time at which the state change occurred to a stored time when a most recent state change occurred, and determine if the time difference meets a difference threshold T5. If the determination is 'no' 503, the processor is configured to return to the beginning step 500.

If the determination is 'yes' 504, at step 506 the processor is configured to determine which of the three magnetometer axes is most indicative of a direction of door travel. The determination may be made, for example, by identifying which axis exhibited the greatest change in signal field amplitude.

At step 507, the processor is configured to determine whether the determined door state change resulted in an increase or decrease in field amplitude.

If the determination is the detected field increased 509, at step 510 the processor is configured to set a direction calibration to +1 parameter, indicating that a door opening event is associated with an increase in magnitude of the signal of the selected axis. If the determination is the detected field decreased 508, at step 511 the processor is configured to set a direction calibration to −1 parameter, indicating that a door opening event is associated with a decrease in magnitude. The processor is configured to identify the door state by application of the calibration direction parameter to the door change event. Referring again to FIG. 4, if the calibration was +1, events 400 and 402, which are associated with rising signal magnitude, would be determined to be door openings, whereas 401, which is associated with decreasing signal magnitude, would be determined to be a door closing.

In one exemplary embodiment, the moving mean calculation is based on the average of the previous six magnetometer samples. Further, the threshold calculated at step 303 is based on 10% of the more recent magnetometer sample. Further, the processor is configured to determine a door state change when the last five recorded samples each meet the threshold. It should be understood that where calculations are made based on a number of samples, that the number of samples is typically synonymous with a time period, since samples are recorded at regular time intervals.

The process outlined by FIG. 5 therefore operates to determine whether a door is open or closed. This data is useful in addition to internal temperature cabinet information for the purpose of identifying a fault with a cabinet refrigeration system. For example, if the door has remained closed for a period of time and the cabinet interior temperature rises, this may indicate a fault with a connected refrigeration system. However, if a temperature rise coincides with a door being left open, then operation of the connected refrigeration system is unlikely to be at fault.

Further, the automated determination of the door opening and closing state allows retro-fitment of the apparatus 10 to a variety of refrigerated appliances without the need to preconfigure the detector. Monitoring of door state and interior temperature can therefore be applied to any refrigerated appliance.

Another advantage of the apparatus of the invention it is that the above described functionality can be provided by a low cost, low power, robust, contactless device. Further, the detector allows a large degree of freedom in device mounting position and orientation which is important if using untrained personnel to attach it to a large range of fridge models in the field. Further, the apparatus is largely immune to door sag and other door/cabinet alignment issues.

As indicated above the invention may also encompass a number of different techniques or algorithms executed by a processor integrated into the apparatus to detect the state or position of a cabinet door. In some embodiments the processor may execute an algorithm which incorporates steps which:
- sample instantaneous received sensor or sensors output signal in at least one of three orthogonal axes,
- filter noise from the signal
- execute a self-tuning edge detection algorithm on the filtered signal, and
- determine a change of door state when any detected edge is not rejected.

Those skilled in the art will appreciate that well-known signal processing techniques and technology may be used to sample instantaneously received magnetic sensor output signals over one or more orthogonal axes. In preferred embodiments the sensor signal or signals may be sampled over at least two orthogonal axes, and in further preferred embodiments may be sampled over three orthogonal axes.

Preferably the sampled signals may be filtered to remove noise. Again those skilled in the art will appreciate that a range of well-known signal processing techniques may be employed to remove or mitigate the effect of various noise sources from sampled signals.

For example in preferred embodiments sampled magnetic field signals may be filtered to remove or reduce the impact of signal noise caused by the intermittent operation of nearby electrical devices. In various embodiments this filtering may—for example—remove 50 or 60 Hz noise components from the sample signal. Those skilled in the art will appreciate that that a high-speed notch filter or similar may be employed to implement the noise filter used by the invention in various embodiments. Furthermore additional forms of filters may also be applied to the sampled signals in further embodiments if desirable.

In some embodiments the processor may execute a self-tuning edge detection algorithm on the filtered signal or signals. An edge as detected by such an algorithm may be described as a rapid or large magnitude change in a characteristic of the signal, which with the present invention can indicate a change in position or state of the cabinet door. Such edge events identified in the magnetic field signal may have associated characteristics, variables or valuables derived from the signal itself and also associated with a time instant or period over which the edge event occurred.

In various embodiments the edge detection algorithm used exhibits a self-tuning character by maintaining and utilising a magnetic field calibration associated with a known closed-door state or position. This calibration can be updated or refreshed frequently to account for ambient or environmental changes to provide this self-tuning character.

In preferred embodiments the edge detection algorithm utilised may determine and format a vector for an instantaneous measured magnetic field relative to the magnetic field calibration for the closed-door state. As a consequence of the way the instantaneous magnetic field vector is formatted it will have an effective zero length or magnitude when it matches with the magnetic field calibration for the closed-door state. Conversely if the instantaneous magnetic field vector formatted by this algorithm relates to a moving or open door state the resulting vector will have a non-zero magnitude or length.

In a further preferred embodiment the magnitude of the determined instantaneous measured magnetic field vector is differentiated over time to detect edges or edge events. This differential of the vector magnitude will yield a positive value in situations where a door is moving away from the closed position and hence provide an edge which indicates that the door has been opened.

Preferably the value of this differential of the vector magnitude may be compared with a change threshold value, with differentials which do not meet the change threshold being rejected and differentials which meet the change threshold being accepted as indicating a change of door state from closed to open. Those skilled in the art will appreciate the actual value of the change threshold being applied will depend on the specific installation in which the invention is employed as well as various characteristics of the apparatus itself, such as the form of the sensor or sensors utilised. The change threshold selected may therefore be determined based on both these sets of characteristics in addition to an acceptable rate of false positive or false negative edge detections.

In a preferred embodiment detected edges which exhibit a differential value below the change threshold may be rejected and detected edges which exhibit a differential value equal to or exceeding the change threshold will be accepted as indicating a change of door state from closed to open. As indicated above the change threshold value may be selected depending on the specific circumstances in which the invention is used and acceptable rates of false positives and false negative detections.

In additional further embodiments the processor may also execute an additional step of refreshing the magnetic field calibration associated with the closed-door state. This calibration may be refreshed using the sampled instantaneously received sensor output signal when a sample period rejected for not containing an edge indicating a door opening event exhibits a differential value which meets a stability threshold value. In such embodiments this stability threshold value may be compared with the differential of the vector magnitude to determine if the cabinet door is stationary and in a closed position. Preferably in various implementations of such embodiments the magnetic field calibration associated with the closed door state may be refreshed when a rejected edge differential exhibits a value which equals or is below the stability threshold value.

Those skilled in the art will appreciate that the calibration maintained for a closed door state may be refreshed or updated using the current instantaneous sensor output or outputs in various ways. For example in some embodiments the current calibration may simply be replaced by the current instantaneous magnetic field vector which meets the stability threshold value referenced above. In other embodiments a rolling average or composite calibration may be maintained by integrating the current instantaneous sensor outputs with sensor outputs accepted for closed-door states from other time periods. Those skilled in the art will appreciate that various mechanisms may be employed to refresh this calibration in a range of embodiments depending on the environment in which the associated refrigeration cabinet is located.

Figure 6:
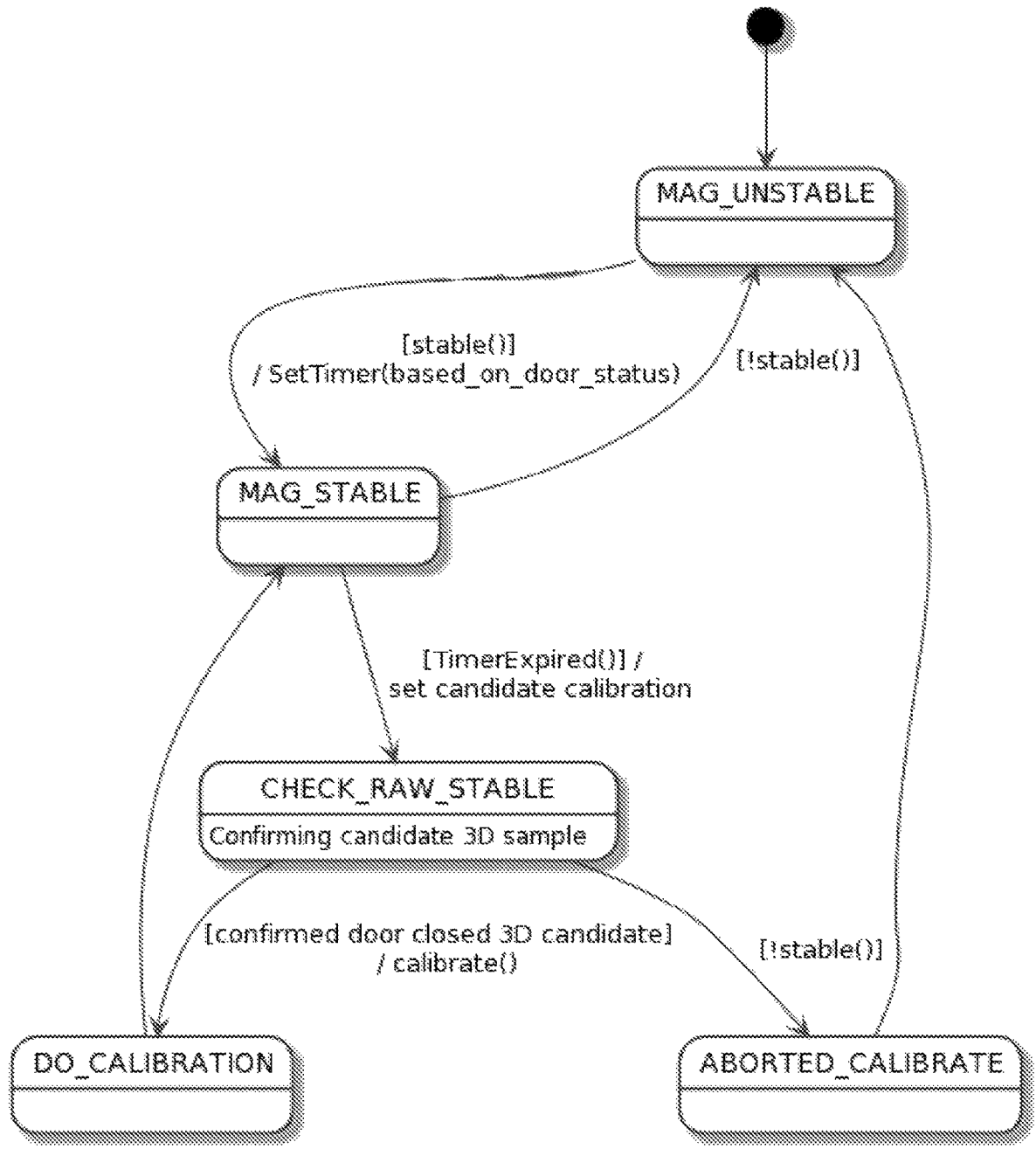
FIG. 6 shows a flow chart of processor steps as implemented in a further embodiment executed to determine if operating conditions are suitable to refresh a calibration used in this embodiment.

FIG. 6 shows a flow chart of processor steps as implemented in a further embodiment, which is executed to determine if operating conditions are suitable to refresh the calibration.

This flowchart effectively represents the operation of a state machine where the calibration is updated based on whether the algorithm has been in a state of MAG_STABLE for a suitable period of time without changes occurring which would render the new calibration invalid.

The input to this state machine is in some embodiments a sampling, filtering and edge detection process as described further in with respect to FIG. 7 below.

The process shown in FIG. 6 is instantiated in the initial MAG_UNSTABLE state, which represents the state where the sensor signal is too unstable for calibration to occur (or at least, in the case of instantiation, is not known to be otherwise). In this state, a calibration timer is set which varies depending on whether the most recently known door state is open or closed. Typically this timer is set for a short period when the door is closed and a long period when the door is open: this allows for rapidly repeating calibration updates while the door is closed and minimises the chance of erroneously recalibrating while the door is open, while allowing the system to eventually self-correct if door open and door closed positions have become confused. The algorithm then moves to the MAG_STABLE state.

It remains in this state either until an edge is detected which would render the calibration invalid, or until the calibration timer specified above expires, indicating that sufficient data has been acquired to acquire a calibration. If an edge is detected before the timer expires, the algorithm moves to the MAG_UNSTABLE state, updates the timer duration if appropriate, and returns to the MAG_STABLE state to restart the calibration. If an edge is not detected before the timer expires, a candidate calibration is then created and the algorithm then moves to the CHECK_RAW_STABLE state.

In the CHECK_RAW_STABLE state, the algorithm reviews the signal input from the most recent CHECK_RAW_STABLE period and determines whether it has been stable enough that the calibration is valid. This operation allows for the fact that delays associated with filtering mean that an edge may have occurred during the MAG_STABLE state but not have been detected until after that state was exited.

If the calibration is determined to be valid, the algorithm moves to the DO_CALIBRATION state. In this state, the calibration used by the underlying signal processing algorithm (such as that shown in FIG. 7) is updated. It is assumed that this calibration represents the signal level associated with a closed door, since the different timer periods associated with exiting the MAG_UNSTABLE state make it unlikely that the DO_CALIBRATION state will be reached while the door is open. The algorithm then returns to the MAG_STABLE state and re-commences the calibration acquisition procedure.

If the calibration is instead determined in the CHECK_RAW_STABLE state to be invalid, the algorithm moves from the CHECK_RAW_STABLE state to the ABORTED_CALIBRATE state. In this state, it discards the candidate calibration, and then moves to the MAG_UNSTABLE state, where the process begins anew.

Figure 7:
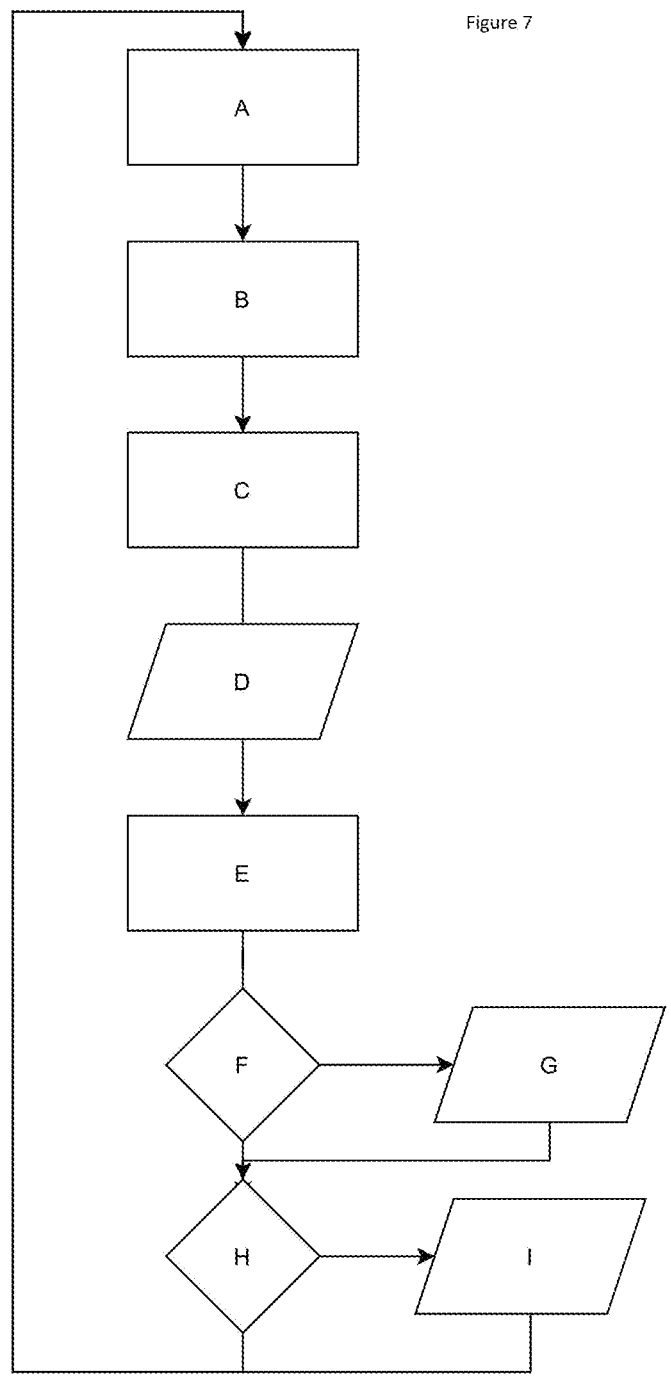
FIG. 7 FIG. 7 shows a flow chart illustrating in more detail the steps undertaken in a sampling, filtering and edge detection process able to be utilised in the process illustrated with respect to FIG. 6.

FIG. 7 shows a flow chart illustrating in more detail the steps undertaken in a sampling, filtering and edge detection process which can provide input to the process discussed with respect to FIG. 6.

At step A of this process the processor receives magnetic field strength signal samples representing the magnetic field experienced by sensors used by the invention in three dimensions. Next at step B the sampled signal is processed by a notch filter to remove 50 and 60 Hz noise components.

At step C the filtered three-dimensional magnetic field strength signal is formatted as a vector relative to a closed-door magnetic field calibration. If the current sampled filtered signal matches the closed-door calibration the resultant vector will be of a zero length. If the sampled field does not match the calibrated closed-door field the resultant vector will exhibit a comparatively large magnitude.

At step D the vector is output to the state machine of FIG. 6 to be used in calculation of an updated calibration.

At step E the magnitude of the vector determined at step C is differentiated relative to time in an edge detection process. This time differential of vector magnitude can provide an indication of edge events associated with rapid rates of change of the sampled magnetic field relative to the magnetic field of a closed-door state.

At step F this differential is compared with a change threshold value and if exceeded the cabinet door is determined to have changed state.

If in this case the differential is negative, the door is determined to have transitioned to a closed state, while if it is positive, the door is determined to have transitioned to an open state. A flag is set accordingly at step G which will determine timer settings in the state machine of FIG. 6. The door state change is also output to any other parts of the device's program which deal with event logging or other actions relating to door movement.

At step H the same differential is compared with a stability threshold value.

If the absolute value of the differential determined is above the stability threshold the signal is deemed not to be in a sufficiently stable state to update the threshold, and a flag is set at step I which triggers any in-process calibration to be aborted or rejected by the state machine of FIG. 6.

This process therefore allows cabinet door position to be determined relatively easily when considering that the default or most likely state of the cabinet door will be 'closed'. By using a magnetic field calibration based on this state rapid rate of change edge events can be detected and associated with the door moving to a 'not closed' state. Differences between a sampled magnetic field and the closed-door magnetic field are considered when a non-zero length vector is returned from the above-referenced step C. However by using a comparison to the time-based differential of this magnitude the invention can distinguish between rapid rate of change door state change edge events and the relatively slow rate of changed edge events caused by small changes in the magnetic field environment of the refrigerated cabinet. Instead of discarding such samples they can be used in a self-calibration process to update the closed door calibration to account for environmental base drift in the magnetic field experienced in the interior of the refrigerated cabinet. By considering a rate of change in such embodiments the in operation of the invention are simplified, eliminating the need to consider specific axes or dimensions which of magnetic field signal which the might have the most significance or relevant relevance to door opening events.

Furthermore in various embodiments the rate of increase or decrease in differences between the sampled magnetic field and the closed-door calibration may be used to indicate a direction of motion for a cabinet door. In particular a positive value differential of the vector magnitude considered at steps E and F can be used to indicate that the cabinet door is currently opening. Alternatively a negative value differential can be used to indicate that the cabinet door is currently moving towards the closed position.

Figure 8:
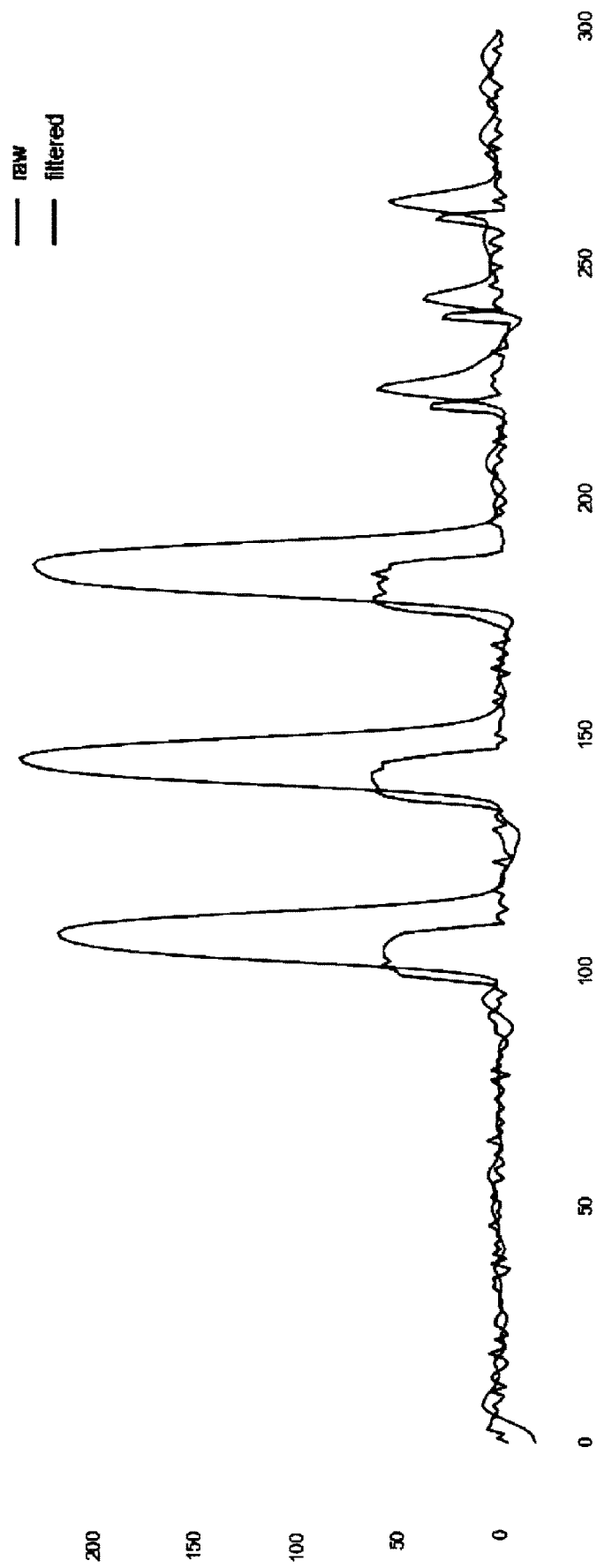
FIG. 8 shows a time based plot of magnetic field vector magnitude as utilised in the processes discussed with respect to FIGS. 6 and 7.
Figure 9:
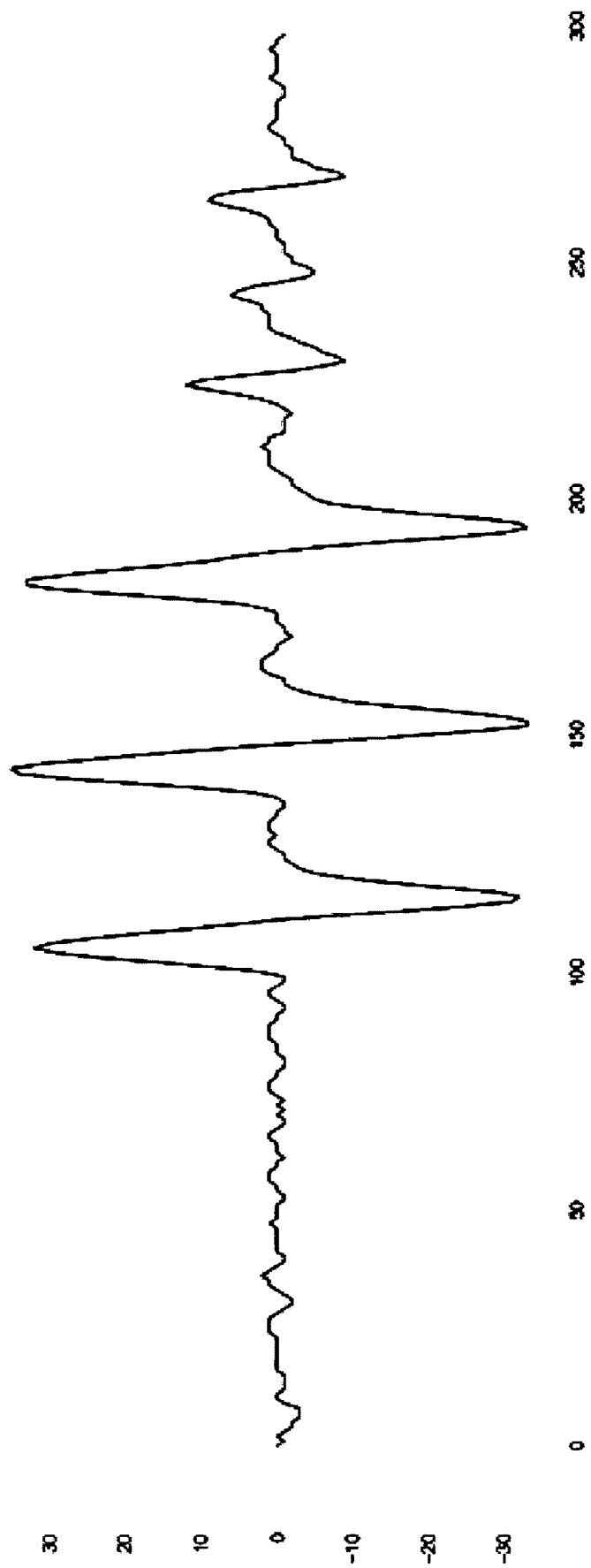
FIG. 9 shows a time based plot of the time differential of the magnetic field vector magnitude shown with respect to FIG. 8.

FIG. 8 shows a time based plot of magnetic field vector magnitude as utilised in the processes discussed with respect to FIGS. 6 and 7. For comparison the lower magnitude signal shown represents the contribution of one axis only of a magnetic field sensor output prior to combination with two additional axis and prior to filtering being undertaken. FIG. 9 in turn shows a time based plot of the time differential of the magnitude of the filtered 3-dimensional combined magnetic field vector shown with respect to FIG. 8.

As can be seen from FIG. 8 the magnitude of the vector calculated experiences significant peaks of over 200 units at timestamps 110, 145 and 190. A further set of three peaks are experienced after timestamp 200 which have significantly smaller magnitudes.

FIG. 9 shows the related time differential with rapid rates of change for the first three peaks, which in the embodiments discussed with respect FIGS. 6 and 7 trigger a determination that the cabinet door has moved from the closed state. As can be seen from FIG. 9 the alternating positive and negative values of the this differential can also be used to indicate the time periods at which the door is moving away from the closed state, and then back towards the closed state.

The magnitude of the differential shown for the remaining three peaks after timestamp 200 is too small to trigger a determination that the cabinet door is no longer closed but are within the bounds of a stability threshold assessment. The sampled magnetic field captured after timestamp 200 can therefore be used in the embodiment of FIGS. 6 and 7 to refresh the closed door state magnetic field calibration maintained by the invention.

FIG. 10a through 10e show a number of line drawings of various installation positions for a door position detection apparatus equivalent to that discussed with respect to FIG. 1.

Figure 10A:
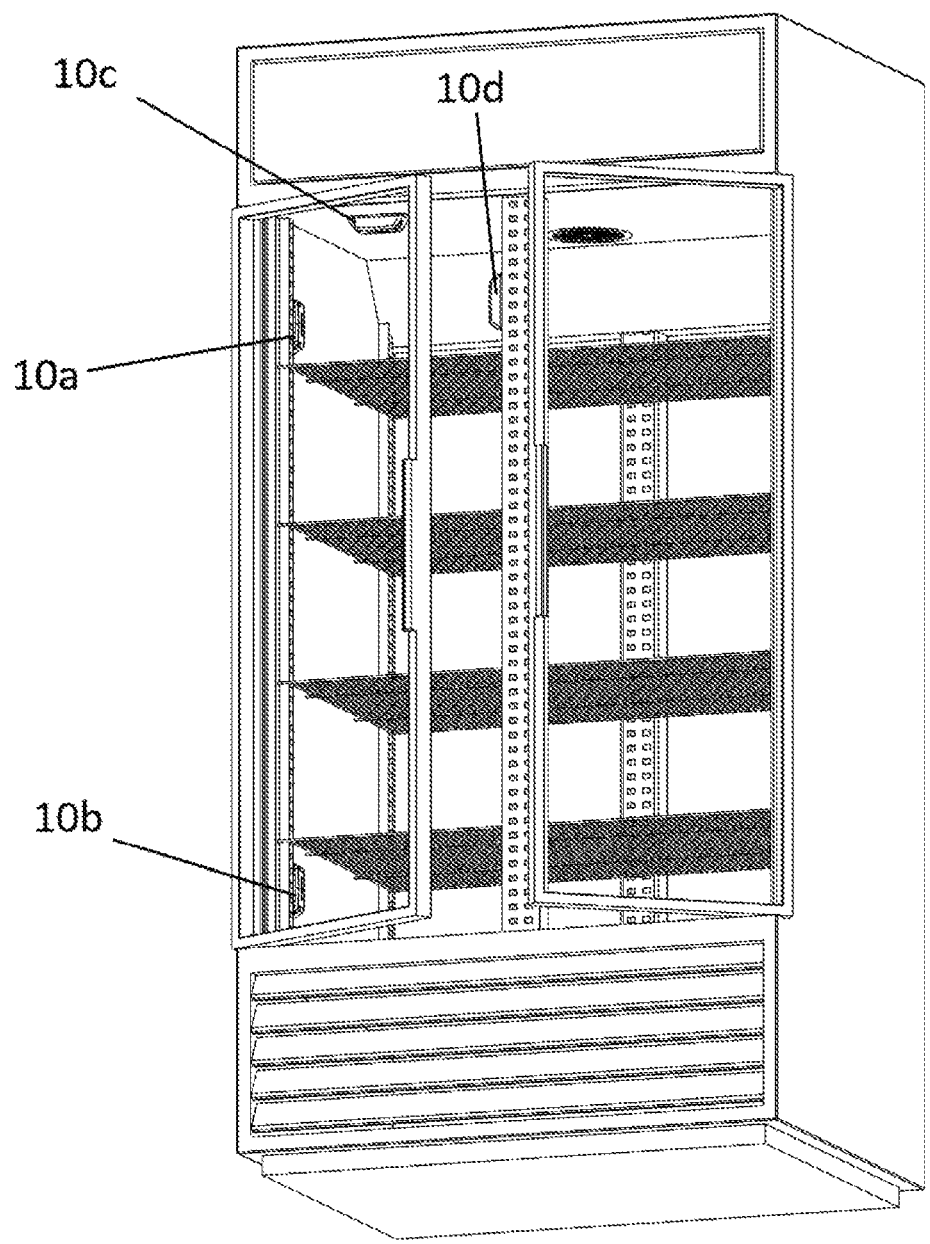
FIGS. 10a through 10e show a number of line drawings of various installation positions for a detector device equivalent to that discussed with respect to FIG. 1.

In particular FIG. 10a illustrates a variety of installation positions for the apparatus including: at the top 10a and bottom 10b of the hinge side of the interior of the cabinet; on the ceiling 10c of the cabinet interior; and engaged with the central door bar 10d within the interior of the cabinet As can be seen from FIG. 10a a variety of obstacles such as shelves and a vertical light bar are already present within the interior of the cabinet, and the flexibility afforded by the invention in installation positions allows these obstacles to be avoided.

Figure 10B:
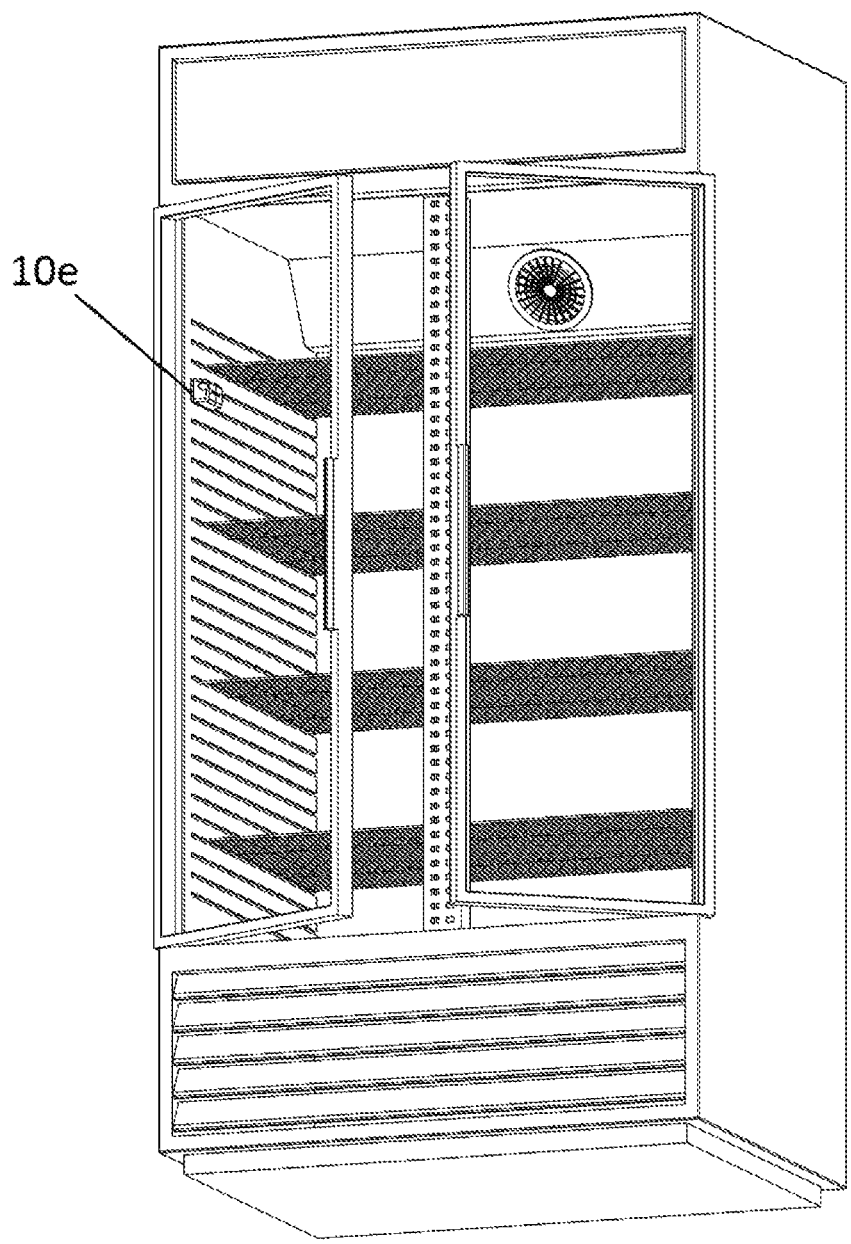

Similarly FIG. 10b shows a further interior side wall detector mounting 10e, where the apparatus can be provided with a horizontal orientation when compared with the apparatus 10a, 10b shown in FIG. 10a. As can be seen from FIG. 10b this horizontal mounting orientation allows the apparatus to avoid the shelves and mounting slots formed on the side wall of the cabinet.

Figure 10E:
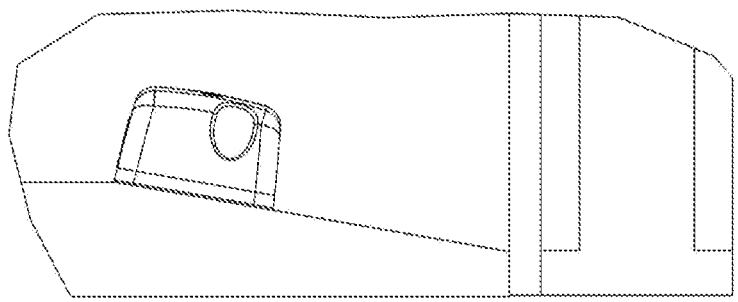
Figure 10D:
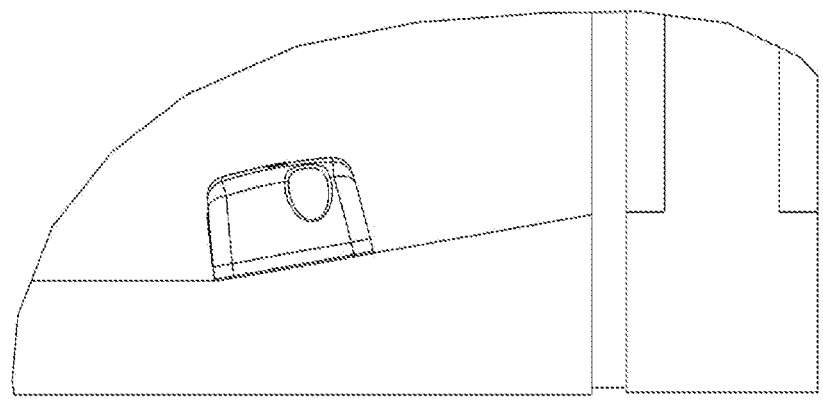
Figure 10C:
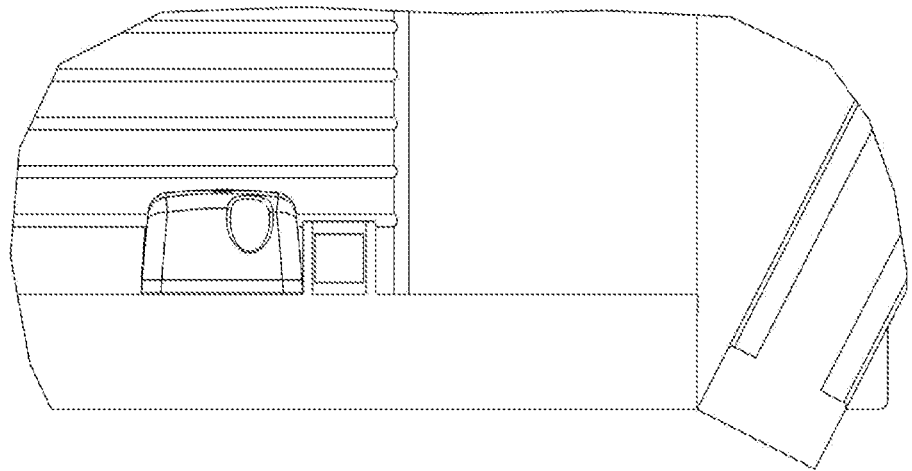

FIGS. 10c, 10d and 10e provide a range of views illustrating a variety of installation orientations which can be employed for the apparatus depending on the arrangement of the interior surfaces of a refrigerator cabinet and any components projecting from these interior surfaces. In particular the apparatus can be mounted to accommodate projections extending from the interior walls of the cabinet as shown by FIG. 10c, while similarly FIGS. 10d and 10e show how the detector can be mounted effectively on various types of sloping interior surfaces.

Figure 11A:
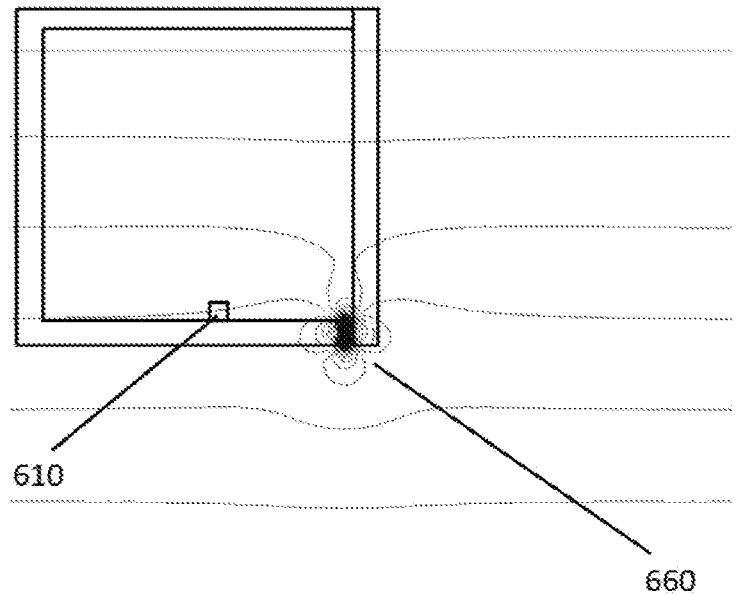
FIGS. 11a and 11b provide schematic views of magnetic flux lines within the interior of a refrigerated cabinet which installed a detector device equivalent to that of FIG. 1.
Figure 11B:
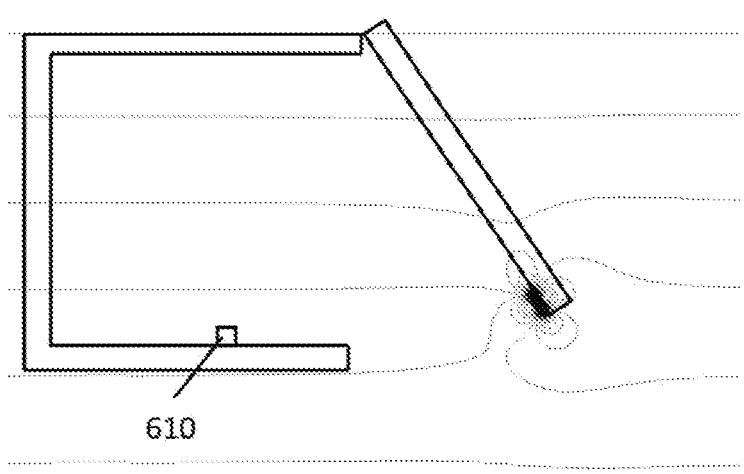

FIGS. 11a and 11b provide schematic views of magnetic flux lines within the interior of a refrigerated cabinet which has a door position detection apparatus installed which is equivalent to that of FIG. 1.

As can be seen from FIG. 11a the door is closed on the cabinet with the magnetic flux lines of the magnetic structure 660 it houses extending a short distance into the interior the cabinet. These flux lines have a limited range and do not extend to the mounting position of the apparatus 610. The presence of the magnet also cause perturbations in the background magnetic field extending to a distance considerably greater than that to which flux generated by the magnetic structure radiates. The apparatus 610 is exposed to this perturbation of the background magnetic field when the door is in the closed position shown with respect to FIG. 11a.

FIG. 11b illustrates the same arrangement as that of FIG. 11a but with the door having moved to an open position. As can be seen from this figure the absence of the magnet close to the interior of the cabinet no longer causes a perturbation in the background magnetic field. The apparatus 610 is configured to detect this change in the magnetic flux field within the interior of the cabinet induced by the motion of the magnetic field generating structure mounted to the door. This detected change is then used to detect the opening and closing of the door.

Those skilled in the art will also appreciate that in some embodiments the functionality provided by the routines discussed above may be provided in alternative ways, such as being split among more routines or consolidated into less routines. Similarly, in some embodiments illustrated routines may provide more or less functionality than is described, such as when other illustrated routines instead lack or include such functionality respectively, or when the amount of functionality that is provided is altered. In addition, while various operations may be illustrated as being performed in a particular manner and/or in a particular order, those skilled in the art will appreciate that in other embodiments the operations may be performed in other orders and in other manners.

In the preceding description and the following claims the word "comprise" or equivalent variations thereof is used in an inclusive sense to specify the presence of the stated feature or features. This term does not preclude the presence or addition of further features in various embodiments.

From the foregoing it will be appreciated that, although specific embodiments have been described herein for purposes of illustration, various modifications may be made without deviating from the spirit and scope of the invention. Accordingly, the invention is not limited except as by the appended claims and the elements recited therein. In addition, while certain aspects of the invention are presented below in certain claim forms, the inventors contemplate the various aspects of the invention in any available claim form. For example, while only some aspects of the invention may currently be recited as being embodied in a computer-readable medium, other aspects may likewise be so embodied.

What I claim is:

1. An apparatus adapted to attach to the interior of a cabinet, the cabinet having at least one door arranged to transition between an open state where the interior of the cabinet is accessible, and a closed state, the door including a magnetic field generating structure configured to magnetically engage the door with the cabinet in the closed state, wherein the apparatus includes:
   a housing configured to attach to the interior of the cabinet;
   one or more sensors configured to determine change in the magnetic flux field within the interior of the cabinet induced by motion of the magnetic field generating structure in at least one of three orthogonal axes, where the motion of the magnetic field generating structure in the one or more axes is indicative of the cabinet door moving between the closed state and the open state, and generating an output signal representing the sensed magnetic field change; and
   a processor configured to execute steps of algorithm including:
   sample the instantaneous received sensor output signal of at least one axis
   filter noise from the signal,
   executing a self-tuning edge detection algorithm on the filtered signal,
   reject any edges which are not due to a door being opened and/or closed, and
   determine a change of door state when any detected edge is not rejected.

2. The apparatus as claimed in claim 1 wherein the one or more sensors are configured to determine change in the magnetic flux field in three orthogonal axes.

3. The apparatus as claimed in claim 1 adapted to mount to the interior of the cabinet at up to about 100 mm from the door frame and/or magnetic field generating structure.

4. The apparatus as claimed in claim 1 which includes one or more sensors operable to determine a temperature for the interior of the cabinet.

5. The apparatus as claimed in claim 1 wherein the magnetic flux field within the interior of the cabinet is primary/predominantly provided by the magnetic field of the planet earth.

6. The apparatus as claimed in claim 1 wherein the interior of the cabinet lies outside of primary flux paths of the magnetic field generating structure.

7. The apparatus as claimed in claim 1 wherein the sensor is configured to determine changes in the magnetic flux field in the order of 0-10 Gauss.

8. The apparatus as claimed in claim 1 wherein a self-tuning edge detection algorithm executed on the filtered signal determines and formats a vector for the instantaneous measured magnetic field relative to a magnetic field calibration for a closed door state.

9. The apparatus as claimed in claim 8 wherein the magnitude of the determined instantaneous measured magnetic field vector is differentiated over time to detect edges.

10. The apparatus as claimed in claim 9 wherein detected edges which do not meet a change threshold value are rejected and detected edges which meet the change threshold value indicate a change of door state.

11. The apparatus as claimed in claim 10 wherein detected edges which equal or exceed the change threshold value indicate a change of door state from closed to open if the differentiated value is positive in magnitude, and from open to closed if negative.

12. The apparatus as claimed in claim 10 further characterised by the additional step of refreshing the magnetic field calibration for the closed door state using the sampled instantaneously received sensor output signal when the differentiated signal meets a stability threshold value.

13. The apparatus as claimed in claim 12 wherein the magnetic field calibration for the closed door state is refreshed when the differentiated signal exhibits a value which equals or is below a stability threshold value.

14. The apparatus as claimed in claim 1 wherein the processor updates a door state variable from closed state to a not closed state when a detected edge is not rejected and determines a change of door state, and the processor subsequently updates the door state variable from the not closed state to the closed state after the expiry of a delay timer.

15. An apparatus adapted to attach to the interior of a cabinet, the cabinet having at least one door arranged to transition between an open state where the interior of the cabinet is accessible, and a closed state, the door including a magnetic field generating structure configured to magnetically engage the door with the cabinet in the closed state, wherein the apparatus includes:

a housing configured to attach to the interior of the cabinet;

one or more sensors configured to determine change in the magnetic flux field within the interior of the cabinet induced by motion of the magnetic field generating structure in at least one of three orthogonal axes, where the motion of the magnetic field generating structure in the one or more axes is indicative of the cabinet door moving between the closed state and the open state, and generating an output signal representing the sensed magnetic field change; and a processor configured to receive the sensor output signal and detect a change of door state by the steps of:
  (i) sample the instantaneous received sensor output signal of at least one axis after each of a first time period,
  (ii) repeatedly determine an average of sampled instantaneous sensor output signals, for at least one axis, over a second time period,
  (iii) determine a difference between an instantaneous determined average value and a previous determined average value preceding by a third time period,
  (iv) compare the determined difference to a difference threshold, and
  (v) determine a change of door state when:
    the threshold is met, and
    the threshold is met for at least a threshold time period.

16. The apparatus as claimed in claim 15 wherein the sensor apparatus is further configured to determine the axis with the largest signal of three orthogonal axes, and the at least one axis is the at least one axis with the largest signal.

17. The apparatus as claimed in claim 15 wherein the sensor apparatus is further configured to, when the threshold is met, determine a magnitude and orientation of a vector sum of three axes of the sensor output signal, and determine a change of door state when the vector sum meets a threshold for at least a fourth period of time.

* * * * *